United States Patent
McIntosh et al.

(10) Patent No.: US 10,511,223 B2
(45) Date of Patent: Dec. 17, 2019

(54) VOLTAGE REGULATOR HAVING BOOST AND CHARGE PUMP FUNCTIONALITY

(71) Applicant: Allegro MicroSystems, LLC, Manchester, NH (US)

(72) Inventors: James McIntosh, East Lothian (GB); Robert Stoddard, Lincoln, MA (US); Robert D. Christie, Fife (GB)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/833,296

(22) Filed: Dec. 6, 2017

(65) Prior Publication Data

US 2018/0166984 A1   Jun. 14, 2018

Related U.S. Application Data

(60) Provisional application No. 62/432,108, filed on Dec. 9, 2016.

(51) Int. Cl.
| | |
|---|---|
| *G05F 1/10* | (2006.01) |
| *H02M 3/07* | (2006.01) |
| *H02M 3/158* | (2006.01) |
| *H02H 7/12* | (2006.01) |
| *H03L 7/089* | (2006.01) |
| *H02M 3/08* | (2006.01) |
| *H02M 1/08* | (2006.01) |
| *H02M 3/155* | (2006.01) |
| *H02M 1/00* | (2006.01) |

(52) U.S. Cl.
CPC ............ *H02M 3/07* (2013.01); *H02H 7/1213* (2013.01); *H02M 1/08* (2013.01); *H02M 3/08* (2013.01); *H02M 3/155* (2013.01); *H02M 3/1582* (2013.01); *H03L 7/0896* (2013.01); *H02M 2001/0045* (2013.01)

(58) Field of Classification Search
CPC ...... H01L 2924/00; H02M 3/07; H02M 3/156
See application file for complete search history.

(56) References Cited

U.S. PATENT DOCUMENTS

| | | |
|---|---|---|
| 4,974,141 A | 11/1990 | Severinsky et al. |
| 5,528,125 A | 6/1996 | Marshall et al. |
| 5,548,464 A | 8/1996 | Manning |
| 5,602,463 A | 2/1997 | Bendall et al. |

(Continued)

FOREIGN PATENT DOCUMENTS

WO   WO 2015/054186 A1   4/2015

OTHER PUBLICATIONS

Fairchild Semiconductor Corporation, "Design and Application Guide of Bootstrap Circuit for High-Voltage Gate-Drive IC," AN-6076; Rev. 1.4; Dec. 18, 2014; Retrieved from www.fairchildsemi.com; 13 Pages.

(Continued)

*Primary Examiner* — Sibin Chen
(74) *Attorney, Agent, or Firm* — Daly Crowley Mofford & Durkee, LLP

(57) ABSTRACT

Methods and apparatus for a voltage regulator having a boost module and a charge pump module. In embodiments, the charge pump module is configured to operate in multiple modes. In embodiments, an IC package includes the boost module and the charge pump with a shared component, such as a capacitor.

65 Claims, 10 Drawing Sheets

(56) References Cited

U.S. PATENT DOCUMENTS

| | | | |
|---|---|---|---|
| 5,831,418 | A | 11/1998 | Kitagawa |
| 5,998,980 | A | 12/1999 | Schieke et al. |
| 6,166,527 | A | 12/2000 | Dwelley et al. |
| 6,275,016 | B1 | 8/2001 | Ivanov |
| 6,982,527 | B2 | 1/2006 | Lee et al. |
| 7,388,560 | B2 | 6/2008 | Yamamoto et al. |
| 7,501,882 | B2 | 3/2009 | Rasaratnam |
| 7,660,090 | B1 | 2/2010 | Daugherty |
| 7,786,712 | B2 | 8/2010 | Williams |
| 7,923,865 | B2 | 4/2011 | Melse |
| 7,960,955 | B2 | 6/2011 | Ito et al. |
| 8,339,049 | B2 | 12/2012 | Kang et al. |
| 8,456,105 | B2 | 6/2013 | Wang et al. |
| 8,519,630 | B2 | 8/2013 | Wang et al. |
| 8,664,930 | B2 | 3/2014 | Kang et al. |
| 8,742,682 | B1 | 6/2014 | Wang et al. |
| 8,791,672 | B2 | 7/2014 | Klein et al. |
| 8,901,835 | B2 | 12/2014 | Kang et al. |
| 8,937,433 | B1 | 1/2015 | Wang et al. |
| 9,048,729 | B2 | 6/2015 | Kumagai et al. |
| 9,209,757 | B1* | 12/2015 | Thandri ............... H03F 1/0227 |
| 9,291,478 | B2 | 3/2016 | Contaldo et al. |
| 9,614,428 | B2 | 4/2017 | Garvey et al. |
| 9,621,041 | B2 | 4/2017 | Sun et al. |
| 2008/0158915 | A1 | 7/2008 | Williams |
| 2008/0278221 | A1 | 11/2008 | Rowland |
| 2008/0284498 | A1* | 11/2008 | Xu ........................ H02M 3/07 327/536 |
| 2009/0121707 | A1 | 5/2009 | Schott |
| 2009/0167260 | A1 | 7/2009 | Pauritsch et al. |
| 2010/0053054 | A1* | 3/2010 | Jeong ................. G09G 3/3674 345/92 |
| 2010/0164491 | A1 | 7/2010 | Kejik et al. |
| 2011/0148509 | A1* | 6/2011 | Pan ...................... G11C 5/145 327/536 |
| 2012/0176820 | A1 | 7/2012 | Li et al. |
| 2012/0280502 | A1* | 11/2012 | Bouvier ................. B60K 6/46 290/45 |
| 2013/0100710 | A1 | 4/2013 | Kang et al. |
| 2013/0106365 | A1 | 5/2013 | Ang |
| 2013/0320941 | A1 | 12/2013 | Contaldo et al. |
| 2013/0328416 | A1* | 12/2013 | Whitworth ............ H02J 17/00 307/149 |
| 2014/0210359 | A1 | 7/2014 | Raval et al. |
| 2014/0354349 | A1 | 12/2014 | Liu et al. |
| 2014/0361966 | A1* | 12/2014 | Kita .................... G09G 3/3674 345/87 |
| 2016/0239040 | A1 | 8/2016 | Ripley |
| 2016/0241142 | A1* | 8/2016 | Scheel ................. H02M 3/073 |
| 2016/0347605 | A1* | 12/2016 | Thompson ........... B81B 3/0086 |
| 2017/0054363 | A1 | 2/2017 | Mangtani et al. |

OTHER PUBLICATIONS

"Bootstrap Circuit for High-Side MOSFET Driver," Retrieved from Electrical Engineering Stack Exchange Forum on http://electronics.stackexchange.com on Dec. 7, 2016; 5 Pages.

DRV3201-Q1, "3 Phase Motor Driver-IC for Automotive Safety Applications," Data Sheet; Rev. D, SLVSBD6D—May 2012, Revised Aug. 2015; Retrieved on Nov. 16, 2016 from www.ti.com; 5 Pages.

DRV3201-Q1, "3 Phase Motor Driver-IC for Automotive Safety Applications," Product Overview, Rev. D; Retrieved on Nov. 16, 2016 from www.ti.com; 3 Pages.

Melexis: Microelectronic Integrated Systems, ""Under-the-Hood" Triaxis Rotary Position feat. SENT Protocol;" MLX90324; Data Sheet, Rev. 001; Dec. 2008; 40 Pages.

U.S. Restriction Requirement dated Apr. 20, 2015 for U.S. Appl. No. 13/484,640; 7 Pages.

Response to U.S. Restriction Requirement dated Apr. 20, 2015 for U.S. Appl. No. 13/484,640; Response filed Apr. 29, 2015; 1 Page.

U.S. Notice of Allowance dated Nov. 13, 2015 for U.S. Appl. No. 13/484,640; 10 Pages.

U.S. Non-Final Office Action dated Jul. 29, 2016 for U.S. Appl. No. 14/831,958; 15 Pages.

Response to U.S. Non-Final Office Action dated Jul. 29, 2016 for U.S. Appl. No. 14/831,958; Response filed Oct. 26, 2016; 10 Pages.

U.S. Final Office Action dated Nov. 10, 2016 for U.S. Appl. No. 14/831,958; 14 Pages.

Response to U.S. Final Office Action dated Nov. 10, 2016 for U.S. Appl. No. 14/831,958; Response filed Feb. 8, 2017; 10 Pages.

U.S. Second Final Office Action dated Mar. 16, 2017 for U.S. Appl. No. 14/831,958; 17 Pages.

U.S. Non-Final Office Action dated Jul. 29, 2016 for U.S. Appl. No. 14/683,617; 6 Pages.

Response to U.S. Non-Final Office Action dated Jul. 29, 2016 for U.S. Appl. No. 14/683,617; Response filed Oct. 6, 2016; 13 Pages.

U.S. Notice of Allowance dated Dec. 12, 2016 for U.S. Appl. No. 14/683,617; 10 Pages.

European Extended Search Report dated Apr. 26, 2016 for European Application No. 17205898.4; 6 pages.

Response (with Amended Claims) to European Extended Search Report dated Apr. 26, 2018 for European Application No. 17205898.4; Response filed Dec. 12, 2018; 21 Pages.

European Examination Report dated Jan. 24, 2019 for European Application No. 17205898.4; 5 Pages.

Response to European Examination Report dated Jan. 24, 2019 for European Application No. 17205898.4; Response filed Aug. 5, 2019; 8 Pages.

\* cited by examiner

VOLTAGE REGULATOR HAVING BOOST AND CHARGE PUMP FUNCTIONALITY

CROSS REFERENCE TO RELATED APPLICATIONS

The present application claims the benefit of U.S. Provisional Patent Application No. 62/432,108, filed on Dec. 9, 2016, which is incorporated herein by reference.

BACKGROUND

As is known in the art, voltage regulators can automatically maintain a constant voltage level for proper circuit operation. Conventional voltage regulators can be configured as a so-called feed-forward type regulator, for example. Other known regulators can utilize negative feedback control loops. Electronic voltage regulators can be used in wide variety of devices in which a reliable and constant voltage is desirable.

SUMMARY

Embodiments of the present invention provide methods and apparatus for a voltage regulator having boost DC-DC and charge pump mode functionality. In some embodiments, the charge pump mode can have multiple operating modes which may correspond to the presence of, or lack thereof, an external voltage supply. In embodiments, a voltage regulator can generate first and second voltage rails, where the first voltage rail is referenced to the positive rail and the second voltage rail is referenced to the negative rail. In the boost mode, an inductor, which may be external to an IC embodiment, is employed, and in the charge pump mode, an external power supply may be referenced to the negative rail.

In one aspect, a voltage regulator system comprises: a boost module to boost an input voltage signal and provide an output voltage signal on a first output node; and a charge pump module coupled to the boost module to provide the output signal on the first output node.

A voltage regulator system can further include one or more of the following features: the charge pump module and the boost module share a circuit component, the charge pump module and the boost module share a capacitor coupled to the first output node, the charge pump module has a first mode to provide the output signal in combination with the boost module and a second mode to provide the output signal independently from the boost module, the charge pump module is configured to receive an external supply voltage to generate the output signal, the charge pump module includes a capacitor current that flows in one direction during the first mode and the opposite direction during the second mode, the second mode is configured to operate without an inductor, the boost module and charge pump module are provided as part of an IC package, the system is configured to drive a load comprising a bootstrap circuit, the boost module comprises an inductor switching element provided in an IC package configured for connection to an external inductor, a diode, a first capacitor, and the charge pump module comprises switching elements provided in the IC package to control charge and pump phases in first and second modes, the boost module and the charge pump module share the first capacitor, the charge pump module comprises first and second charge pump switching elements coupled to the first capacitor, wherein the first and second charge pump switching elements are conductive during a charge phase of a first mode and non-conductive during a pump phase of the first mode, the first and second charge pump switching elements are non-conductive during a charge phase of a second mode and conductive during a pump phase of the second mode, the second mode corresponds to an external voltage supply coupled to the charge pump module to charge a second capacitor that pumps charge to the first capacitor during the pump phase of the second mode, and/or the charge pump module comprises first and second charge pump switching elements coupled to a first capacitor, and at least one regulator switching element coupled between a second capacitor and a third capacitor, wherein the first and second charge pump switching elements are conductive during a charge phase of a first mode to charge the second capacitor, and non-conductive during a pump phase of the first mode, wherein the at least one regulator switching element is non-conductive during the charge phase of the first mode and conductive during the pump phase to charge the third capacitor for providing an output voltage at the third capacitor.

In another aspect, a method for providing a voltage regulator comprises: employing a boost module to boost an input voltage signal and provide an output voltage signal on a first output node; and employing a charge pump module coupled to the boost module to provide the output signal on the first output node.

A method for providing a voltage regulator can further include one or more of the following features: the charge pump module and the boost module share a circuit component, the charge pump module and the boost module share a capacitor coupled to the first output node, the charge pump module has a first mode to provide the output signal in combination with the boost module and a second mode to provide the output signal independently from the boost module, the charge pump module is configured to receive an external supply voltage to generate the output signal, the charge pump module includes a capacitor current that flows in one direction during the first mode and the opposite direction during the second mode, the second mode is configured to operate without an inductor, the boost module and charge pump module are provided as part of an IC package, the system is configured to drive a load comprising a bootstrap circuit, the boost module comprises an inductor switching element provided in an IC package configured for connection to an external inductor, a diode, a first capacitor, and the charge pump module comprises switching elements provided in the IC package to control charge and pump phases in first and second modes, the boost module and the charge pump module share the first capacitor, the charge pump module comprises first and second charge pump switching elements coupled to the first capacitor, wherein the first and second charge pump switching elements are conductive during a charge phase of a first mode and non-conductive during a pump phase of the first mode, the first and second charge pump switching elements are non-conductive during a charge phase of a second mode and conductive during a pump phase of the second mode, the second mode corresponds to an external voltage supply coupled to the charge pump module to charge a second capacitor that pumps charge to the first capacitor during the pump phase of the second mode, and/or the charge pump module comprises first and second charge pump switching elements coupled to a first capacitor, and at least one regulator switching element coupled between a second capacitor and a third capacitor, wherein the first and second charge pump switching elements are conductive during a charge phase of a first mode to charge the second capacitor, and non-conductive during a pump phase of the first mode, wherein the at least one regulator switching element is non-conductive during the charge phase of the first mode and conductive during the pump phase to charge the third capacitor for providing an output voltage at the third capacitor.

In a further aspect, a voltage regulator system comprises: a boost means for boosting an input voltage signal and providing an output voltage signal on a first output node; and a charge pump means coupled to the boost module for providing the output signal on the first output node.

BRIEF DESCRIPTION OF THE DRAWINGS

The foregoing features of this invention, as well as the invention itself, may be more fully understood from the following description of the drawings in which.

DETAILED DESCRIPTION

Figure 1:
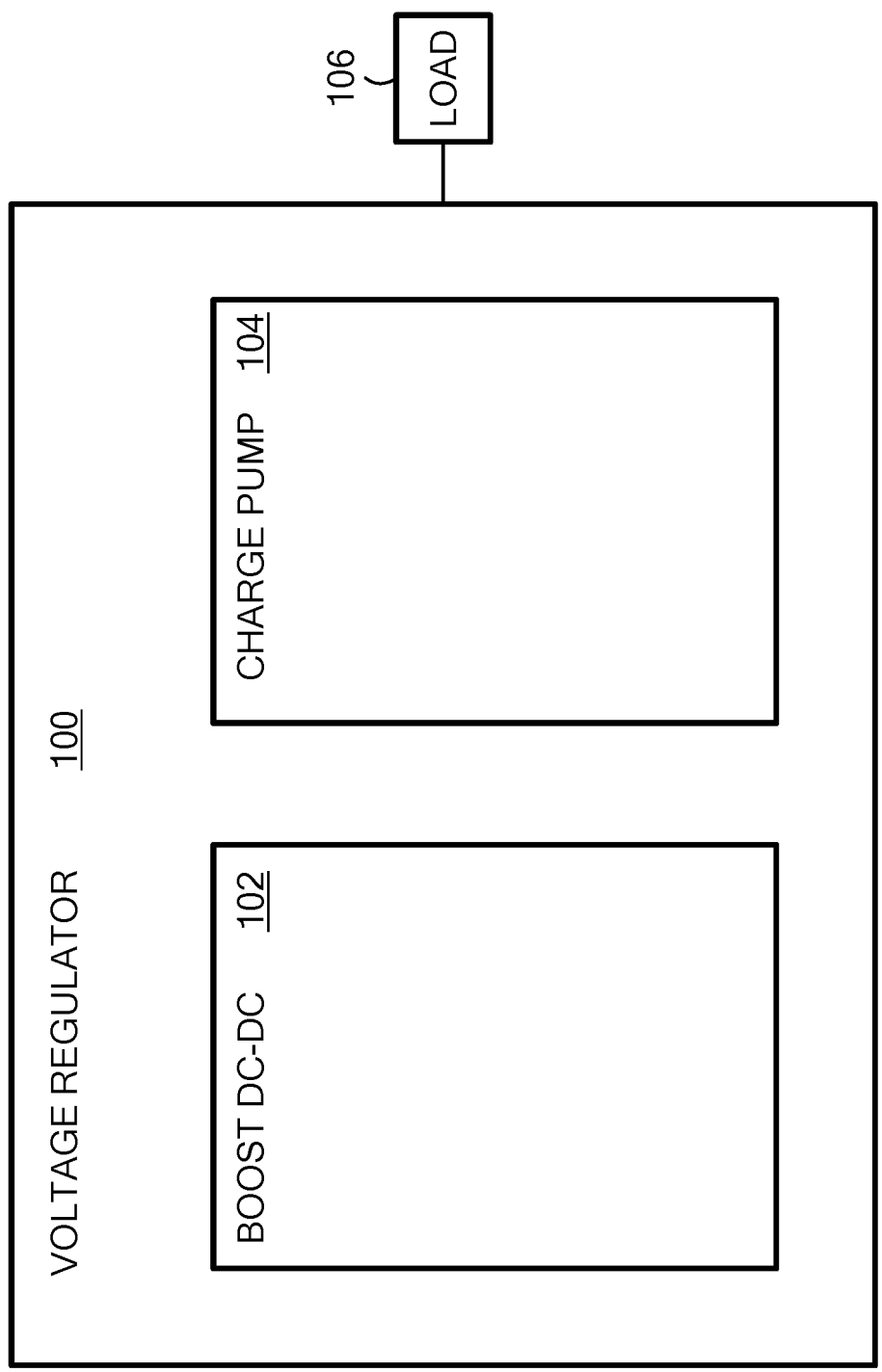
FIG. 1 is a schematic representation of a voltage regulator having a boost module and a charge pump module in accordance with illustrative embodiments of the invention.

FIG. 1 shows an illustrative voltage regulator 100 having a boost DC-DC module 102 and a charge pump module 104 in accordance with illustrative embodiments of the invention. In embodiments, the voltage regulator 100 can be provided in an integrated circuit (IC) package configured for connection to external components, such as inductors, capacitors, diodes and the like. In some embodiments, one or more internal or external components can be common to the boost module 102 and the charge pump module 104. The voltage regulator 100 can be configured to power a load 106. In embodiments, the charge pump module 104 can operate in a first mode when an external voltage supply signal is connected to the charge pump module and in a second mode when an external voltage supply is not connected the charge pump module. In embodiments, the charge pump module 104 can include current flow in opposite directions for charge and pump phases depending upon whether the external voltage supply is connected.

In general, embodiments of the voltage regulator 100 are useful in a variety of applications. While example embodiments of the voltage regulator are shown and described in conjunction a bootstrap circuit for a floating gate MOS driver, it is understood that embodiments of the voltage regulator shown and described herein are applicable to circuits, devices, and systems in general in which it is desirable to provide boost and charge pump functionality and flexibility.

It is further understood that example components and impedance values are shown so as to facilitate understanding of embodiments of the invention. It is readily understood by one of ordinary skill in the art that components and impedance values can vary to meet the needs of a particular application without departing from the scope of the invention.

Figure 2:
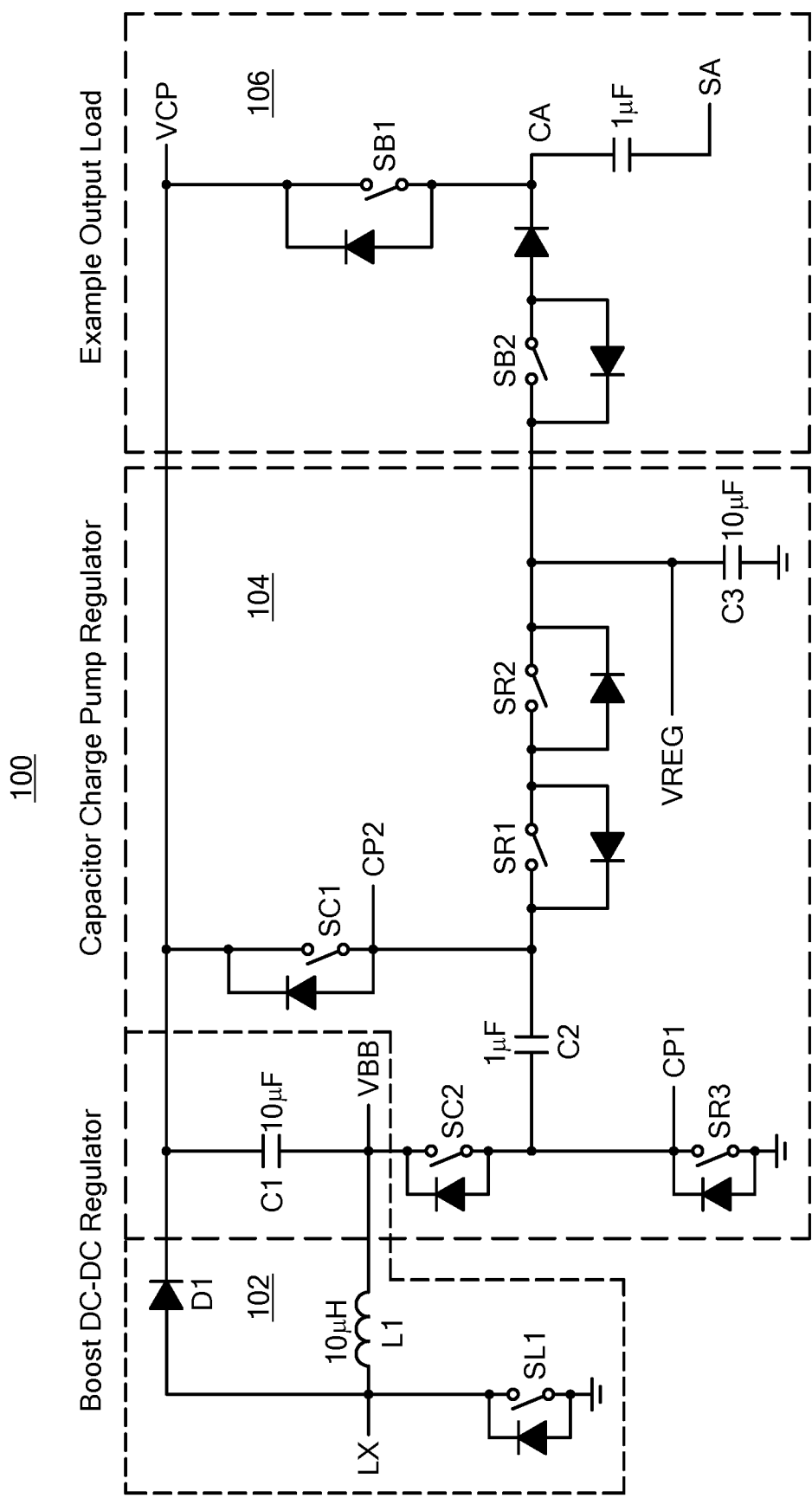
FIG. 2 is a circuit diagram of an example implementation of the voltage regulator of FIG. 1.

FIG. 2 shows an example circuit implementation of the voltage regulator 100 of FIG. 1. In general, the boost module 102 provides a step-up DC-to-DC power converter that steps up voltage while stepping down current from a supply voltage to voltage output. In embodiments, the boost module 102 includes at least one diode and a switching element, such as a transistor, and at least one energy storage element, such as an inductor and/or a capacitor.

In the illustrated embodiment, the boost DC-DC module 102 includes a first boost switch SL1 coupled between ground and a first diode D1. A first capacitor C1 is coupled to the cathode of the first diode D1, such that the first diode D1, the first capacitor C1, and a first inductor L1 form a circuit loop coupled to the first boost switch SL1. The node formed by the cathode of the first diode D1 and the first capacitor C1 provides an output voltage of the boost module 102. In the illustrated embodiment, the output voltage is shown as VCP. A voltage supply VBB, for example 12V, is provided at a node between the first capacitor C1 and the first inductor L1. It is understood that voltage is boosted to VCP relative to voltage VBB.

In general, charge pump module 104 uses energy-storage elements to create a higher or lower voltage power source by using a switching element to control the connection of voltages to the capacitor. For example, a two-stage cycle can be used to generate a higher pulsed voltage from a lower-voltage supply, such that in the first stage, a capacitor is connected across the voltage supply to charge the capacitor to the voltage supply. In the second stage, the circuit connects the capacitor in series with the supply to the load so as to effectively double the supply voltage to the load (the sum of the original supply voltage and the voltage on the capacitor). The voltage level can be smoothed with an output capacitor, for example.

In the illustrative embodiment of FIG. 2, the charge pump module 104 includes first and second charge pump switching elements SC1, SC2. In one embodiment, the first charge pump switching element SC1 is coupled between VCP and one terminal of a second capacitor C2 and the second charge pump switching element SC2 is coupled between VBB and the second capacitor C2.

First and second first regulator switching elements SR1, SR2 are coupled end-to-end between the first charge pump switching element SC1 and the third capacitor C3. A VREG node is located between the second regulator switching element SR2 and the third capacitor C3, which can be coupled to ground. In the illustrated embodiment, a load 106 includes first and second bootstrap switching elements SB1, SB2 coupled end-to-end between VCP and the third capacitor C3. Second and third diodes D2, D3 can be coupled to the first and second bootstrap switching elements SB1, SB2, as shown, as well as a bootstrap capacitor. In embodiments, outputs CA and SA can be configured to provide a gate drive signals for a MOS device.

It is understood that the voltage regulator 100 can be used in a variety of applications in which it is desirable to provide boost and charge pump functionality in a single IC, for example. In the illustrated embodiment, first and second bootstrap switching elements SB1, SB2 are used where power rails provide the supplies for high-side and low-side MOSFETs for n-n half-bridge configurations.

As noted above, in embodiments, a voltage regulator 100 has a boost inductor voltage rail generation mode provided by the boost DC-DC module 102 and an external supply voltage rail generation mode provided by the charge pump module 104. In embodiments, as shown and described more fully below, capacitors and inductors can be provided as external components coupled to an IC having the boost and charge pump circuitry.

In the boost mode of the charge pump module, external inductor L1 is configured in boost mode to generate output voltage VCP. During a first phase, the first and second charge pump switching elements SC1, SC2 are closed, i.e., conductive. During a second phase of boost mode, the first, second, and third regulator switching elements SR1, SR2, SR3 are closed.

In the charge pump mode, an external supply voltage, such as 12 or 15 volts, for example, is boosted to provide VREG. During a first phase, the charge pump switching elements SC1, SC2 are closed, and during a second phase, the regulator switching elements SR1, SR2, SR3 are closed.

In the illustrated embodiment, VREG and GND provide the power rails for a load comprising a low-side MOSFET gate charging and the VCP rail sources the current for the CA-SA high-side MOSFET gate charging.

Embodiments of the invention provide advantages over conventional regulators. For example, by using switched-mode-power-supply (SMPS) techniques to generate the rails, IC power dissipation is reduced. As voltage levels increase, e.g., 48V for automotive applications, reducing power dissipation becomes increasingly desirable. In addition, the VREG rail can be generated using SMPS techniques without having to use complicated Buck-boost topologies. Also, user flexibility is increased as some users may not be able to use inductors (e.g., for boost mode), while other users may not have an external 12V-15V power supply for connect to VREG.

Figures 3A, 3B:
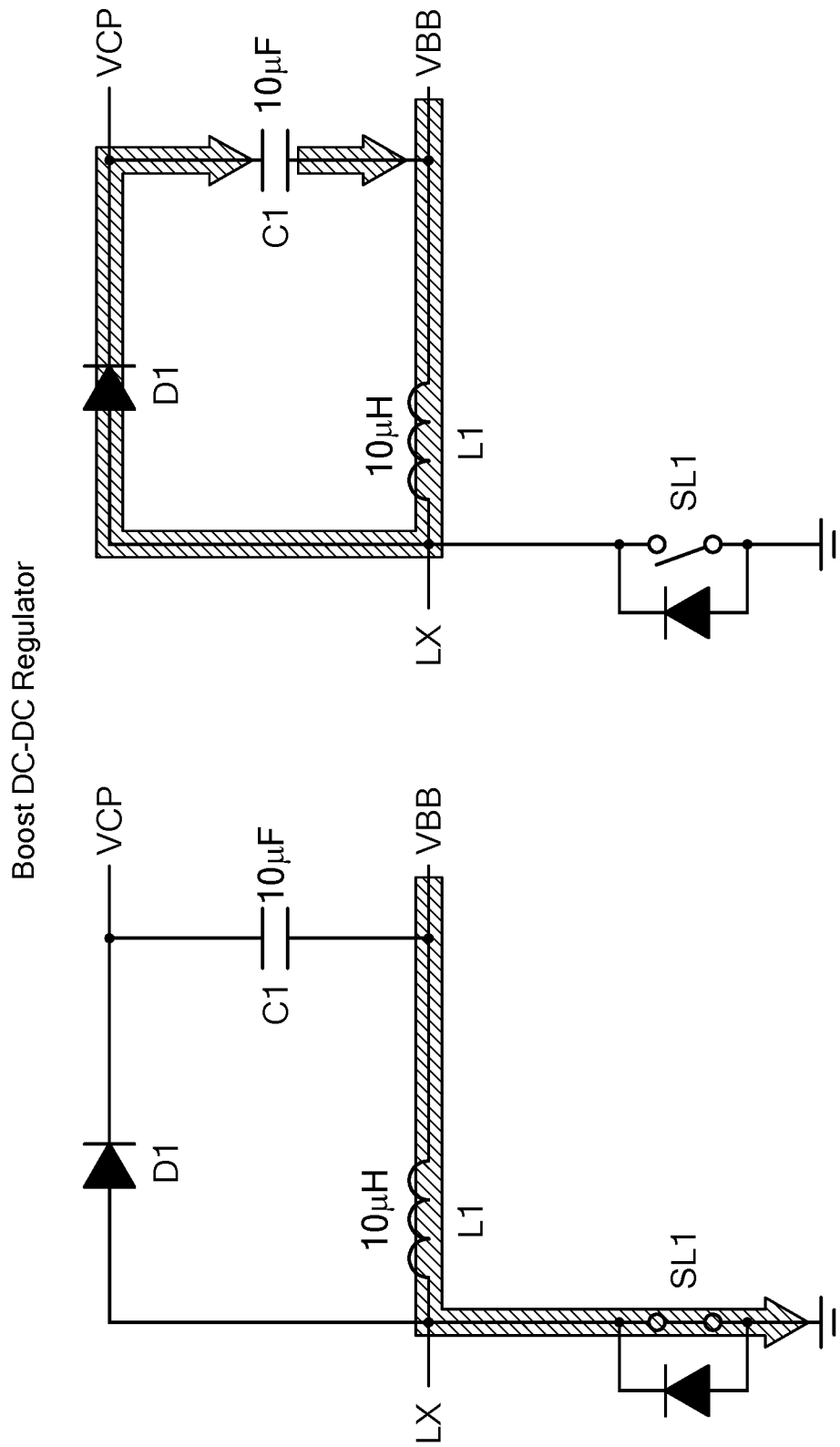
FIG. 3A is an example circuit implementation of the boost module of FIG. 1 in a first phase and FIG. 3B is an example circuit implementation the boost module of FIG. 1 in a second phase.

FIGS. 3A and 3B show operation of the boost DC-DC module 102 of FIG. 1. In the first phase shown in FIG. 3A, the first inductor switching element SL1 is conductive, and in the second phase shown in FIG. 3B the first inductor switching element SL1 is non-conductive, i.e., open. It is understood that voltage VCP is boosted relative to voltage VBB. That is, the voltage on the first capacitor C1 charges to a level corresponding to VCP-VBB. When the first inductor switching element SL1 is conductive, current flows from VBB through the first inductor L1 storing energy by generating a magnetic field. When the first inductor switching element SL1 opens, the energy stored in the first inductor L1 maintains a current toward the load via the first diode D1 as the first capacitor C1 receives charge.

Figure 4:
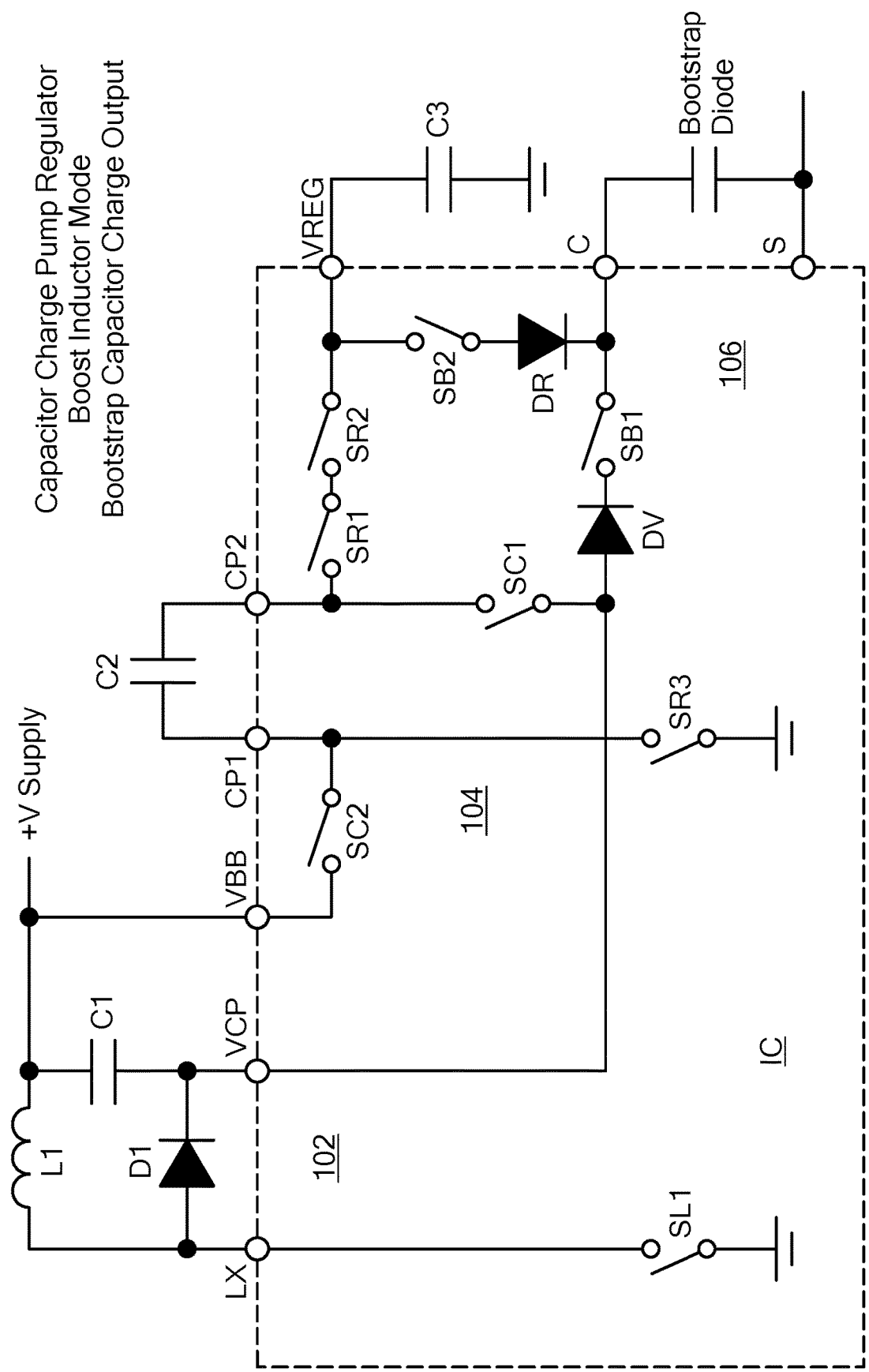
FIG. 4 is a circuit diagram of an example implementation of the voltage regulator of FIG. 1 showing external component connection for an illustrative IC embodiment.
Figure 4A:
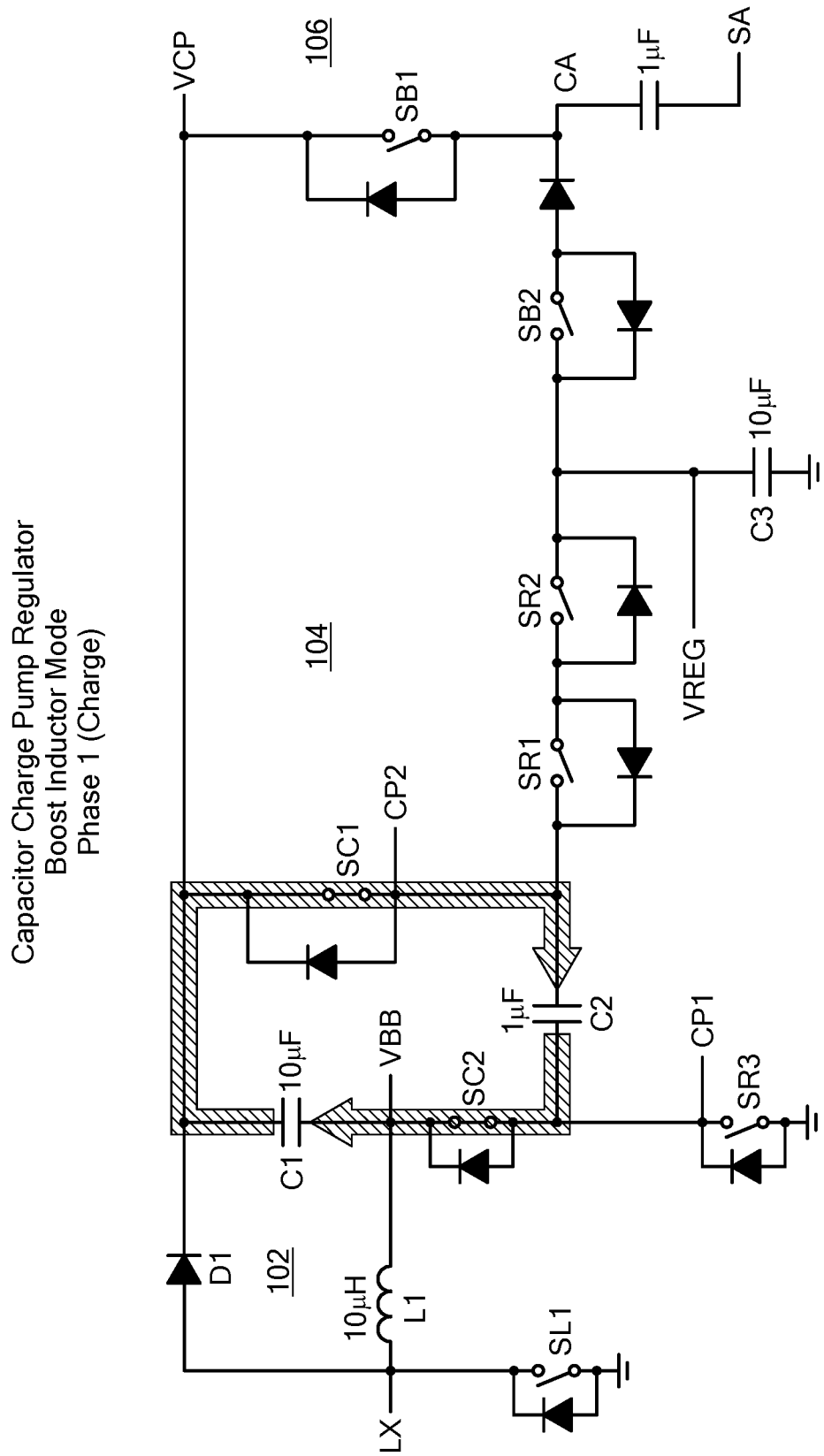
FIG. 4A is an example circuit implementation showing a charge pump module in a boost mode in a charge phase.
Figure 4B:
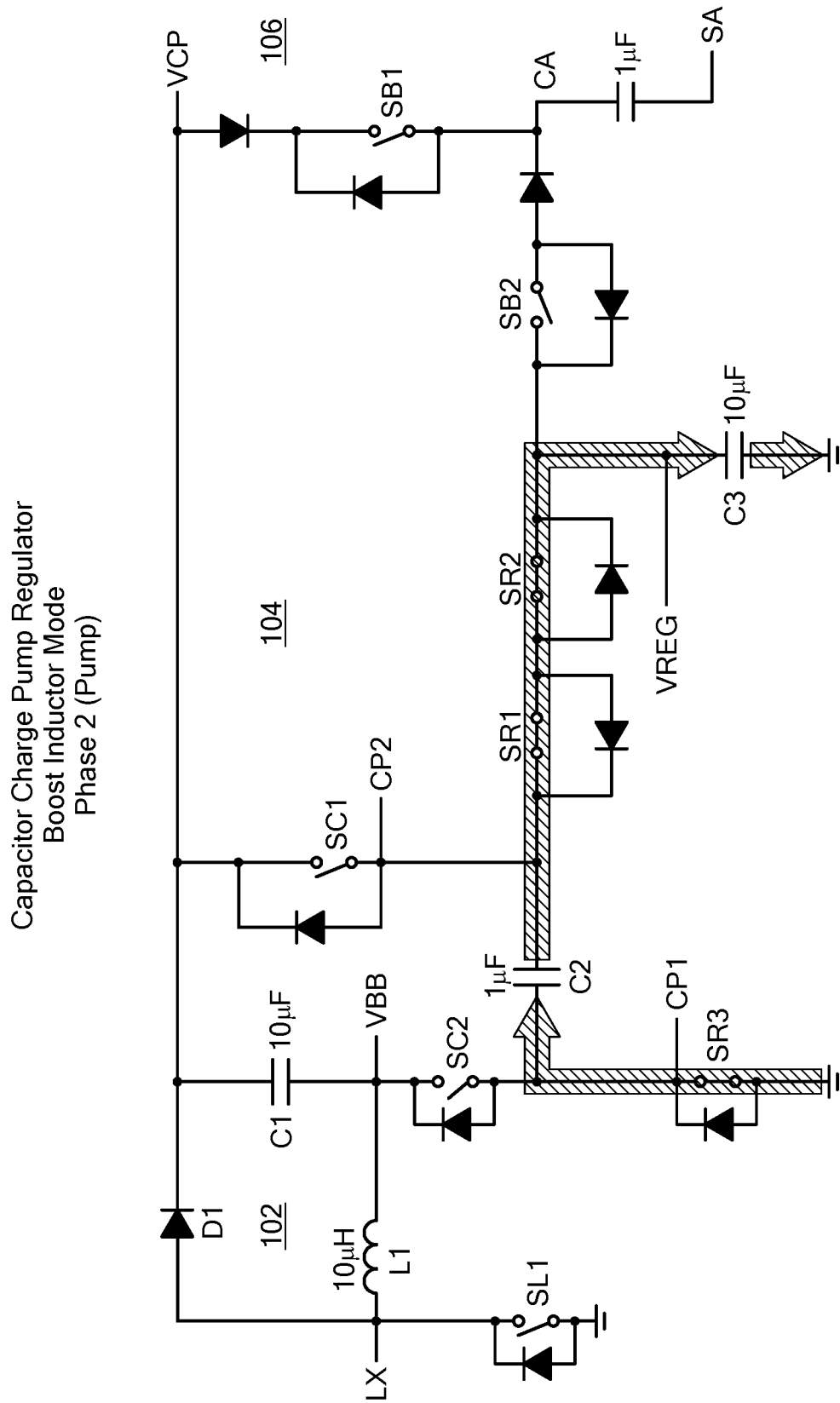
FIG. 4B shows the charge pump module in the boost mode in a pump phase.

FIGS. 4, 4A and 4B show operation of the charge pump module 104 in the boost mode. FIG. 4 shows an example embodiment having an IC with I/O pins LX, VCP, VBB, CP1, CP2, VREG, C, and S. For example, the boost module 102 includes external components L1, D1, and C1. The second capacitor C2 is coupled across pins CP1, and CP2 and the third capacitor C3 is coupled to the VREG pin (no external supply voltage is connected in this mode). In this mode, the boost circuit 102 operates to charge the first capacitor C1 independently of the charge pump circuit 104. In embodiments, the first inductor switching element SL1 may have a different, e.g., higher, switching frequency than the frequency of the first and second charge pump switching elements SC1, SC2.

As shown FIG. 4A, in the first phase (charge), the first and second charge pump switching elements SC1, SC2 are closed so that the second capacitor C2 charges. In FIG. 4B, the first and second charge pump switching elements SC1, SC2 are open and the regulator switching elements SR1, SR2, SR3 are closed so that the second capacitor C2 pumps charge to the third capacitor C3. In embodiments, there is no external supply connection to VREG in this mode.

Figure 5:
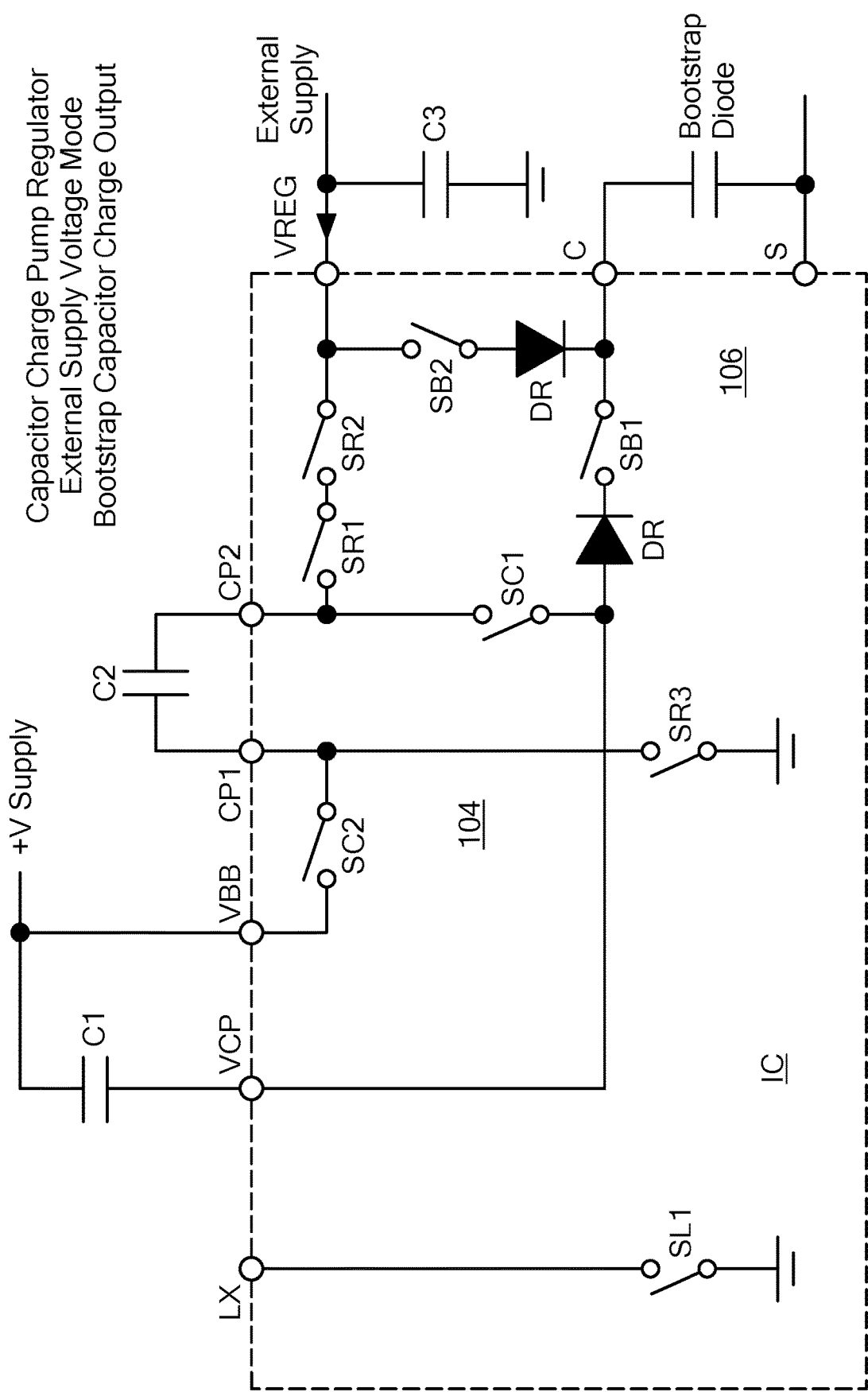
FIG. 5 is a circuit diagram of an example implementation of the voltage regulator of FIG. 1 showing external component connection for an illustrative IC embodiment.
Figure 5A:
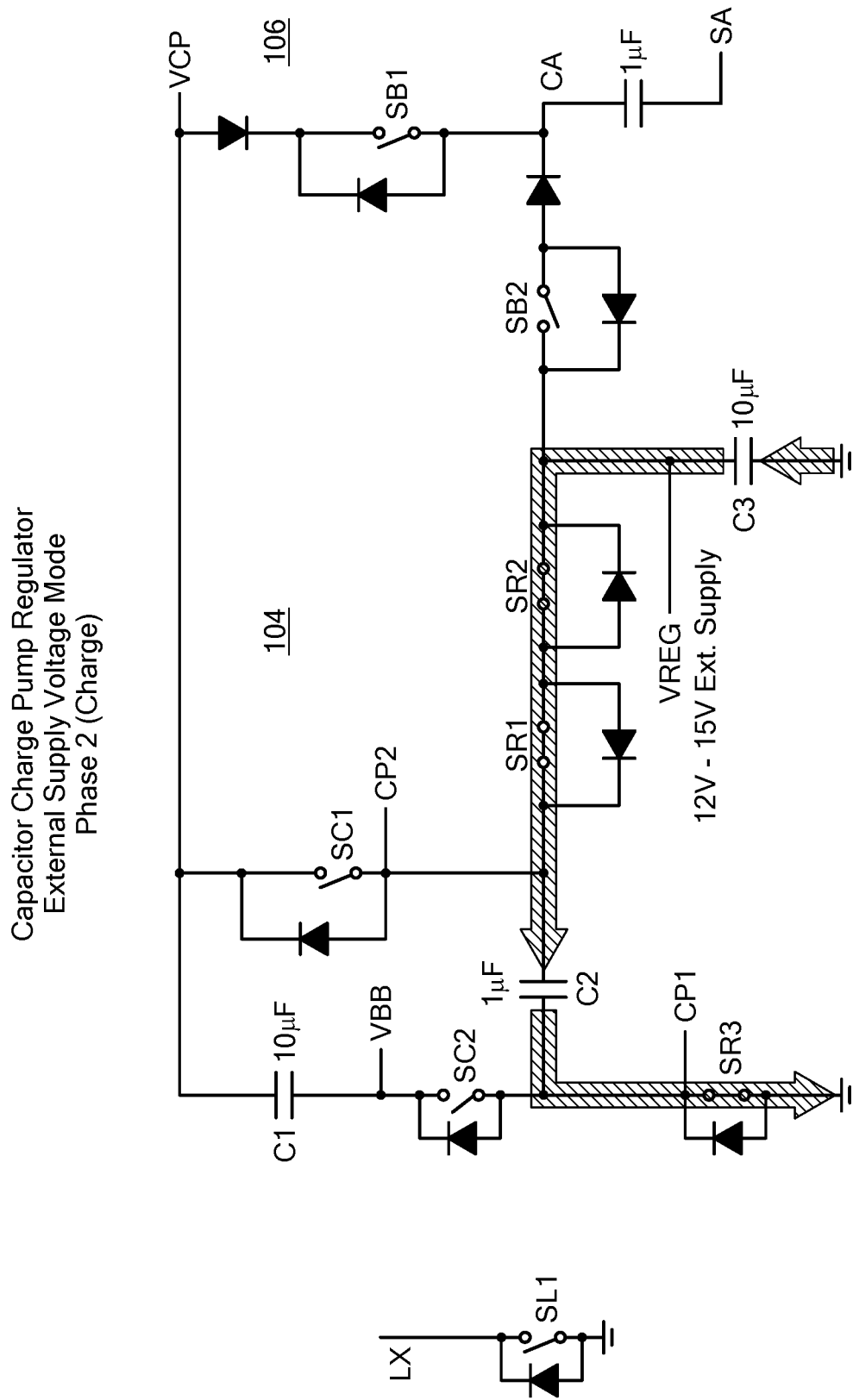
FIG. 5A is an example circuit implementation showing a charge pump module in a mode coupled to an external power supply in a charge phase and FIG. 5B shows the charge pump module in a mode coupled to the external power supply in a pump phase.
Figure 5B:
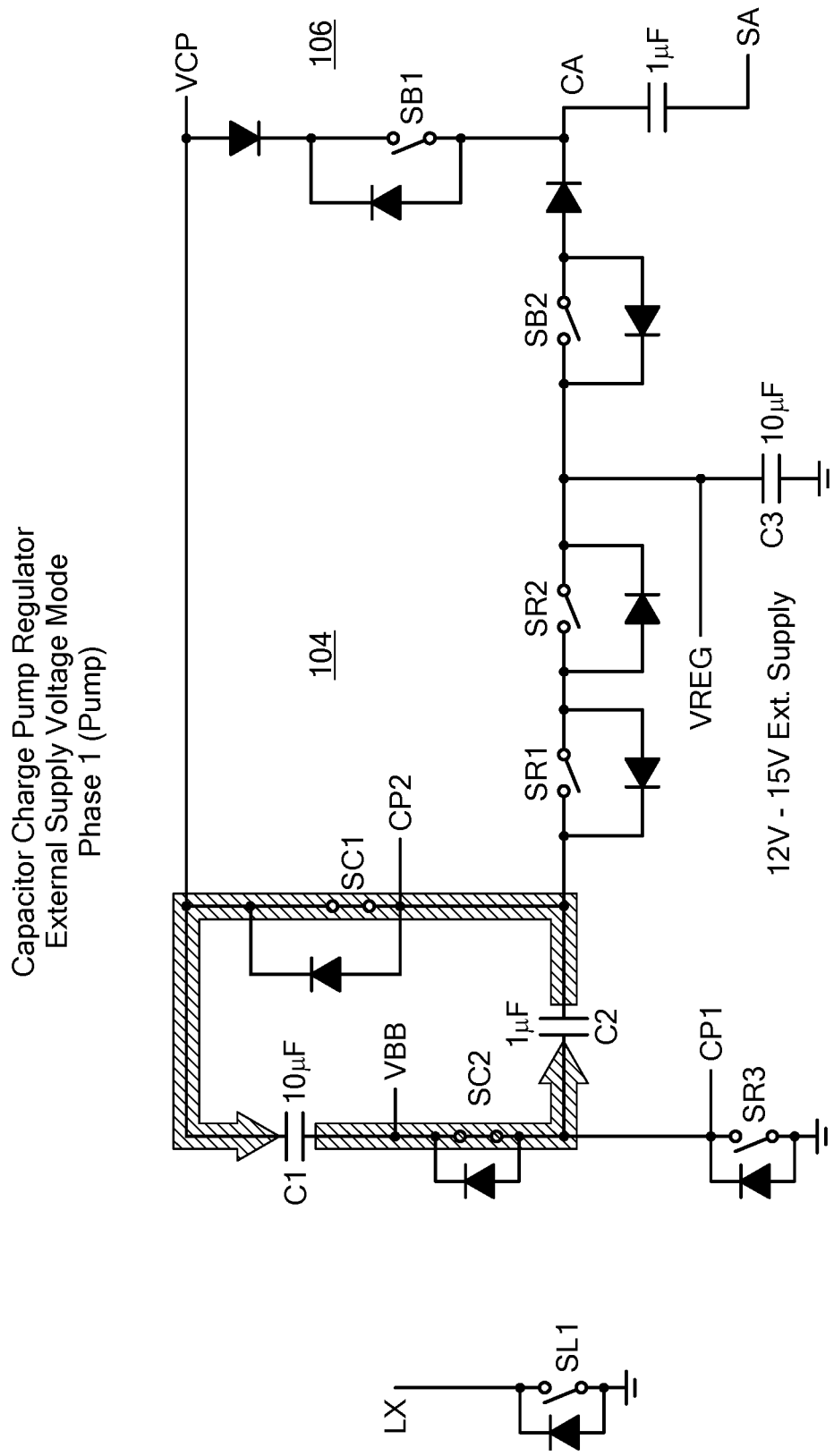

FIGS. 5, 5A and 5B show operation of the charge pump module 104 when an external voltage supply is supplied at VREG with an external third capacitor C3 coupled as shown. In example embodiments, external VREG can range from about 12 to 15 Volts, however, any suitable voltage can be used to meet the needs of a particular application. In embodiments, the boost module is not used so that no boost inductor is connected. As shown, an external first capacitor C1 can be connected between pin VCP and a first voltage supply +V, which can also be coupled to pin VBB.

FIG. 5A shows a charge phase and FIG. 5B shows a pump phase. In the charge phase, the regulator switching elements SR1, SR2, SR3 are closed so that VREG charges the second capacitor C2. In the pump phase shown in FIG. 5B, the first and second charge pump switching elements SC1, SC2 are closed so that the second capacitor C2 pumps charge to the first capacitor C1, which is coupled to VCP.

It should be noted that the current flow direction in the charge pump circuit when external supply is coupled to VREG is the opposite of when no external supply is coupled to VREG. That is, in FIG. 4B the direction of current flow through SR1, SR2 (when closed) is in the opposite direction from FIG. 5A. In embodiments, first and second regulator switching elements SR1, SR2 are coupled in series to enable oppositely oriented blocking diodes to be provided since the voltage can be less than or greater than VBB.

Figure 6:
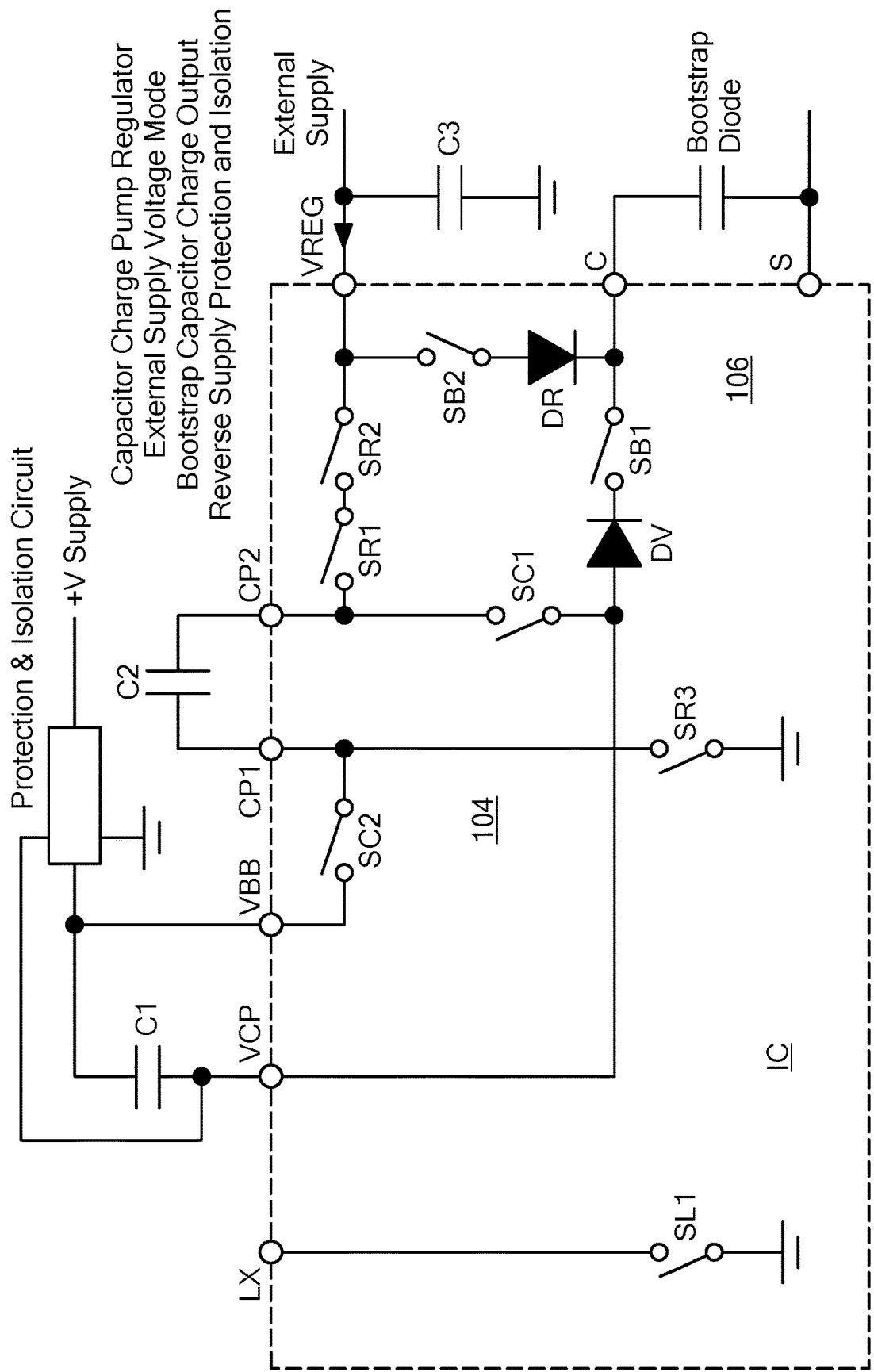
FIG. 6 is a schematic representation of an example integrated circuit package implementation of the voltage regulator of FIG. 1 having a boost module and a charge pump module with a protection/isolation circuit in accordance with illustrative embodiments of the invention.

FIG. 6 shows an example protection and isolation circuit coupled between the IC and a supply voltage +V.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:
1. A voltage regulator system, comprising:
   a boost module to boost an input voltage signal and provide a first output voltage signal on a first output node; and
   a charge pump module coupled to the boost module to provide a second output voltage signal on a second output node, wherein the boost module includes a first capacitor for providing a voltage boost function for the boost module and the charge pump module includes the first capacitor, wherein the boost module comprises an inductor switching element provided in an IC package configured for connection to an external inductor, a diode, the first capacitor, and the charge pump module comprises switching elements provided in the IC package to control charge and pump phases in first and second modes.

2. The system according to claim 1, wherein the boost module charges the first capacitor independently of the charge pump module in a boost mode.

3. The system according to claim 1, wherein the charge pump module is configured to receive an external supply voltage.

4. The system according to claim 3, wherein the charge pump module includes a capacitor current that flows in one direction when the external supply voltage is present and the opposite direction when the external supply voltage is not present.

5. The system according to claim 3, wherein the charge pump module is configured to operate without an inductor when the external supply voltage is present.

6. The system according to claim 1, wherein the boost module and charge pump module are provided as part of an IC package.

7. The system according to claim 1, wherein the system is configured to drive a load comprising a bootstrap circuit.

8. The system according to claim 1, wherein the charge pump module comprises first and second charge pump switching elements coupled to the first capacitor, wherein the first and second charge pump switching elements are conductive during a charge phase of a first mode and non-conductive during a pump phase of the first mode.

9. The system according to claim 8, wherein the first and second charge pump switching elements are non-conductive during a charge phase of a second mode and conductive during a pump phase of the second mode.

10. The system according to claim 9, wherein the second mode corresponds to an external voltage supply coupled to the charge pump module to charge a second capacitor that pumps charge to the first capacitor during the pump phase of the second mode.

11. The system according to claim 1, wherein the charge pump module comprises first and second charge pump switching elements coupled to the first capacitor, and at least one regulator switching element coupled between a second capacitor and a third capacitor, wherein the first and second charge pump switching elements are conductive during a charge phase of a first mode to charge the second capacitor, and non-conductive during a pump phase of the first mode, wherein the at least one regulator switching element is non-conductive during the charge phase of the first mode and conductive during the pump phase to charge the third capacitor for providing an output voltage at the third capacitor.

12. A method for providing a voltage regulator, comprising:
employing a boost module to boost an input voltage signal and provide an output voltage signal on a first output node; and
employing a charge pump module coupled to the boost module to provide a second output voltage signal on a second output node, wherein the boost module includes a first capacitor for providing a voltage boost function for the boost module and the charge pump module includes the first capacitor, wherein the boost module comprises an inductor switching element provided in an IC package configured for connection to an external inductor, a diode, a first capacitor, and the charge pump module comprises switching elements provided in the IC package to control charge and pump phases in first and second modes.

13. The method according to claim 12, wherein the boost module charges the first capacitor independently of the charge pump module in a boost mode.

14. The method according to claim 12, wherein the charge pump module is configured to receive an external supply voltage.

15. The method according to claim 14, wherein the charge pump module includes a capacitor current that flows in one direction when external supply voltage is present and the opposite direction when the external supply voltage is not present.

16. The method according to claim 13, wherein the second mode is configured to operate without an inductor.

17. The method according to claim 12, wherein the boost module and charge pump module are provided as part of an IC package.

18. The method according to claim 12, wherein the system is configured to drive a load comprising a bootstrap circuit.

19. The method according to claim 12, wherein the charge pump module comprises first and second charge pump switching elements coupled to the first capacitor, wherein the first and second charge pump switching elements are conductive during a charge phase of a first mode and non-conductive during a pump phase of the first mode.

20. The method according to claim 19, wherein the first and second charge pump switching elements are non-conductive during a charge phase of a second mode and conductive during a pump phase of the second mode.

21. The method according to claim 20, wherein the second mode corresponds to an external voltage supply coupled to the charge pump module to charge a second capacitor that pumps charge to the first capacitor during the pump phase of the second mode.

22. The method according to claim 12, wherein the charge pump module comprises first and second charge pump switching elements coupled to a first capacitor, and at least one regulator switching element coupled between a second capacitor and a third capacitor, wherein the first and second charge pump switching elements are conductive during a charge phase of a first mode to charge the second capacitor, and non-conductive during a pump phase of the first mode, wherein the at least one regulator switching element is non-conductive during the charge phase of the first mode and conductive during the pump phase to charge the third capacitor for providing an output voltage at the third capacitor.

23. A voltage regulator system, comprising:
a boost means for boosting an input voltage signal and providing an output voltage signal on a first output node; and
a charge pump means coupled to the boost module for providing a second output voltage signal on a second output node,
wherein the boost means includes a first capacitor for providing a voltage boost function for the boost module and the charge pump means includes the first capacitor, wherein the boost means comprises an inductor switching element provided in an IC package configured for connection to an external inductor, a diode, the first capacitor, and the charge pump means comprises switching elements provided in the IC package to control charge and pump phases in first and second modes.

24. The system according to claim 23, wherein the boost means charges the first capacitor independently of the charge pump module in a boost mode.

25. The system according to claim 23, wherein the boost means and charge pump means are provided as part of an IC package.

26. The system according to claim 23, wherein the charge pump module is configured to receive an external supply voltage.

27. The system according to claim 26, wherein the charge pump module includes a capacitor current that flows in one direction when the external supply voltage is present and the opposite direction when the external supply voltage is not present.

28. The system according to claim 26, wherein the charge pump module is configured to operate without an inductor when the external supply voltage is present.

29. The system according to claim 23, wherein the system is configured to drive a load comprising a bootstrap circuit.

30. The system according to claim 23, wherein the charge pump module comprises first and second charge pump switching elements coupled to the first capacitor, wherein the first and second charge pump switching elements are conductive during a charge phase of a first mode and non-conductive during a pump phase of the first mode.

31. The system according to claim 30, wherein the first and second charge pump switching elements are non-conductive during a charge phase of a second mode and conductive during a pump phase of the second mode.

32. The system according to claim 31, wherein the second mode corresponds to an external voltage supply coupled to the charge pump module to charge a second capacitor that pumps charge to the first capacitor during the pump phase of the second mode.

33. The system according to claim 23, wherein the charge pump module comprises first and second charge pump switching elements coupled to the first capacitor, and at least one regulator switching element coupled between a second capacitor and a third capacitor, wherein the first and second charge pump switching elements are conductive during a charge phase of a first mode to charge the second capacitor, and non-conductive during a pump phase of the first mode, wherein the at least one regulator switching element is non-conductive during the charge phase of the first mode and conductive during the pump phase to charge the third capacitor for providing an output voltage at the third capacitor.

34. A voltage regulator integrated circuit package, comprising:
a boost module to boost an input voltage signal and provide a VCP output voltage signal on a first I/O pin for a first mode of operation; and
a charge pump module coupled to the boost module to provide a VREG output voltage signal on a second I/O pin for the first mode of operation,
wherein the boost module includes a circuit having a first capacitor and the charge pump module includes a circuit having the first capacitor such that the circuit for the boost module and the circuit for the charge pump module share the first capacitor, and wherein the boost module comprises an inductor switching element provided in an IC package configured for connection to an external inductor, a diode, the first capacitor, and the charge pump module comprises switching elements provided in the IC package to control charge and pump phases in first and second modes, or
wherein the charge pump module comprises first and second charge pump switching elements coupled to the first capacitor, and at least one regulator switching element coupled between a second capacitor and a third capacitor, wherein the first and second charge pump switching elements are conductive during a charge phase of a first mode to charge the second capacitor, and non-conductive during a pump phase of the first mode, wherein the at least one regulator switching element is non-conductive during the charge phase of the first mode and conductive during the pump phase to charge the third capacitor for providing an output voltage at the third capacitor.

35. The voltage regulator according to claim 34, wherein the charge pump module is configured to provide the VCP output voltage signal on the first I/O pin for a second mode of operation corresponding to the second I/O pin being coupled to external voltage supply signal.

36. A voltage regulator system, comprising:
a boost module to boost an input voltage signal and provide a first output voltage signal on a first output node; and
a charge pump module coupled to the boost module to provide a second output voltage signal on a second output node,
wherein the boost module includes a first capacitor for providing a voltage boost function for the boost module and the charge pump module includes the first capacitor,
wherein the charge pump module comprises first and second charge pump switching elements coupled to the first capacitor, and at least one regulator switching element coupled between a second capacitor and a third capacitor, wherein the first and second charge pump switching elements are conductive during a charge phase of a first mode to charge the second capacitor, and non-conductive during a pump phase of the first mode, wherein the at least one regulator switching element is non-conductive during the charge phase of the first mode and conductive during the pump phase to charge the third capacitor for providing an output voltage at the third capacitor.

37. The system according to claim 36, wherein the boost module charges the first capacitor independently of the charge pump module in a boost mode.

38. The system according to claim 36, wherein the charge pump module is configured to receive an external supply voltage.

39. The system according to claim 38, wherein the charge pump module includes a capacitor current that flows in one direction when the external supply voltage is present and the opposite direction when the external supply voltage is not present.

40. The system according to claim 38, wherein the charge pump module is configured to operate without an inductor when the external supply voltage is present.

41. The system according to claim 36, wherein the boost module and charge pump module are provided as part of an IC package.

42. The system according to claim 36, wherein the system is configured to drive a load comprising a bootstrap circuit.

43. The system according to claim 36, wherein the boost module comprises an inductor switching element provided in an IC package configured for connection to an external inductor, a diode, the first capacitor, and the charge pump module comprises switching elements provided in the IC package to control charge and pump phases in first and second modes, and
wherein the charge pump module comprises first and second charge pump switching elements coupled to the first capacitor, wherein the first and second charge pump switching elements are conductive during a charge phase of a first mode and non-conductive during a pump phase of the first mode.

44. The system according to claim 43, wherein the first and second charge pump switching elements are non-conductive during a charge phase of a second mode and conductive during a pump phase of the second mode.

45. The system according to claim 44, wherein the second mode corresponds to an external voltage supply coupled to the charge pump module to charge a second capacitor that pumps charge to the first capacitor during the pump phase of the second mode.

46. A method for providing a voltage regulator, comprising:
employing a boost module to boost an input voltage signal and provide an output voltage signal on a first output node; and
employing a charge pump module coupled to the boost module to provide a second output voltage signal on a second output node,
wherein the boost module includes a first capacitor for providing a voltage boost function for the boost module and the charge pump module includes the first capacitor,
wherein the charge pump module comprises first and second charge pump switching elements coupled to a first capacitor, and at least one regulator switching element coupled between a second capacitor and a third capacitor, wherein the first and second charge pump switching elements are conductive during a charge phase of a first mode to charge the second capacitor, and non-conductive during a pump phase of the first mode, wherein the at least one regulator switching element is non-conductive during the charge phase of the first mode and conductive during the pump phase to charge the third capacitor for providing an output voltage at the third capacitor.

47. The method according to claim 46, wherein the boost module charges the first capacitor independently of the charge pump module in a boost mode.

48. The method according to claim 46, wherein the charge pump module is configured to receive an external supply voltage.

49. The method according to claim 48, wherein the charge pump module includes a capacitor current that flows in one direction when external supply voltage is present and the opposite direction when the external supply voltage is not present.

50. The method according to claim 46, wherein a second mode is configured to operate without an inductor.

51. The method according to claim 46, wherein the boost module and charge pump module are provided as part of an IC package.

52. The method according to claim 46, wherein the system is configured to drive a load comprising a bootstrap circuit.

53. The method according to claim 46, wherein the charge pump module comprises first and second charge pump switching elements coupled to the first capacitor, wherein the first and second charge pump switching elements are conductive during a charge phase of a first mode and non-conductive during a pump phase of the first mode.

54. The method according to claim 53, wherein the first and second charge pump switching elements are non-conductive during a charge phase of a second mode and conductive during a pump phase of the second mode.

55. The method according to claim 54, wherein the second mode corresponds to an external voltage supply coupled to the charge pump module to charge a second capacitor that pumps charge to the first capacitor during the pump phase of the second mode.

56. A voltage regulator system, comprising:
a boost means for boosting an input voltage signal and providing an output voltage signal on a first output node; and
a charge pump means coupled to the boost module for providing a second output voltage signal on a second output node,
wherein the boost means includes a first capacitor for providing a voltage boost function for the boost module and the charge pump means includes the first capacitor,
wherein the charge pump module comprises first and second charge pump switching elements coupled to the first capacitor, and at least one regulator switching element coupled between a second capacitor and a third capacitor, wherein the first and second charge pump switching elements are conductive during a charge phase of a first mode to charge the second capacitor, and non-conductive during a pump phase of the first mode, wherein the at least one regulator switching element is non-conductive during the charge phase of the first mode and conductive during the pump phase to charge the third capacitor for providing an output voltage at the third capacitor.

57. The system according to claim 56, wherein the boost means charges the first capacitor independently of the charge pump means in a boost mode.

58. The system according to claim 56, wherein the charge pump means is configured to receive an external supply voltage.

59. The system according to claim 58, wherein the charge pump means includes a capacitor current that flows in one direction when the external supply voltage is present and the opposite direction when the external supply voltage is not present.

60. The system according to claim 58, wherein the charge pump means is configured to operate without an inductor when the external supply voltage is present.

61. The system according to claim 56, wherein the boost means and charge pump means are provided as part of an IC package.

62. The system according to claim 56, wherein the system is configured to drive a load comprising a bootstrap circuit.

63. The system according to claim 56, wherein the boost means comprises an inductor switching element provided in an IC package configured for connection to an external inductor, a diode, the first capacitor, and the charge pump means comprises switching elements provided in the IC package to control charge and pump phases in first and second modes, and
wherein the charge pump means comprises first and second charge pump switching elements coupled to the first capacitor, wherein the first and second charge pump switching elements are conductive during a charge phase of a first mode and non-conductive during a pump phase of the first mode.

64. The system according to claim 63, wherein the first and second charge pump switching elements are non-conductive during a charge phase of a second mode and conductive during a pump phase of the second mode.

65. The system according to claim 64, wherein the second mode corresponds to an external voltage supply coupled to the charge pump means to charge a second capacitor that pumps charge to the first capacitor during the pump phase of the second mode.

* * * * *